(12) United States Patent
Fakhruddin et al.

(10) Patent No.: US 8,866,229 B1
(45) Date of Patent: Oct. 21, 2014

(54) SEMICONDUCTOR STRUCTURE FOR AN ELECTROSTATIC DISCHARGE PROTECTION CIRCUIT

(75) Inventors: Mohammed Fakhruddin, San Jose, CA (US); James Karp, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 442 days.

(21) Appl. No.: 13/245,162

(22) Filed: Sep. 26, 2011

(51) Int. Cl.
*H01L 23/62* (2006.01)

(52) U.S. Cl.
USPC .... 257/355; 257/173; 257/360; 257/E29.255; 361/56

(58) Field of Classification Search
USPC ............... 257/173, 360, 355, 548, E29.255; 361/56
See application file for complete search history.

(56) References Cited

U.S. PATENT DOCUMENTS

| | | | |
|---|---|---|---|
| 7,465,994 B2 | 12/2008 | Yu et al. | |
| 7,511,932 B1 | 3/2009 | Gallerno et al. | |
| 7,518,192 B2 | 4/2009 | Yu et al. | |
| 7,833,857 B2 | 11/2010 | Kim | |
| 8,237,225 B2 * | 8/2012 | Kato | 257/355 |
| 2006/0065932 A1 * | 3/2006 | Huang et al. | 257/355 |

OTHER PUBLICATIONS

Wang, Albert Z. H., *On-Chip ESD Protection for Integrated Circuits*, Jan. 31, 2002, pp. 54-55, Kluwer Academic Publishers, Norwell, Massachusetts, USA.

* cited by examiner

*Primary Examiner* — Jose R Diaz
(74) *Attorney, Agent, or Firm* — W. Eric Webostad

(57) ABSTRACT

An embodiment of a semiconductor structure for an electrostatic discharge ("ESD") protection circuit is disclosed. For this embodiment, there is a substrate of a first polarity type. A device area of the substrate has a source region and a drain region of a transistor. The device area is of the first polarity type, and the source region and the drain region are each of a second polarity type. A well region of the second polarity type surrounds the device area. An outer tap of the first polarity type surrounds the well region, and a bridge interconnects the source region and the outer tap.

20 Claims, 8 Drawing Sheets

SEMICONDUCTOR STRUCTURE FOR AN ELECTROSTATIC DISCHARGE PROTECTION CIRCUIT

FIELD OF THE INVENTION

An embodiment of the invention relates to integrated circuit devices ("ICs"). More particularly, an embodiment of the invention relates to a semiconductor structure for an electrostatic discharge protection circuit for an IC.

BACKGROUND

A grounded-gate NMOS ("ggNMOS") structure is conventionally used as an electrostatic discharge ("ESD") protection device, such as a clamp for an ESD pulse. In such a conventional structure, a gate, a source region, and a body region of an NMOS transistor are all connected to one another for connecting to ground. Such body region may be associated with a base region of a parasitic lateral NPN transistor of such NMOS transistor, namely a parasitic NPN bipolar junction transistor ("BJT"). A drain region of such NMOS transistor may be coupled to a pad, such as a voltage supply pad or an input/output ("I/O") pad for example.

In operation, a positive ESD transient with respect to ground appearing at such I/O pad may cause avalanche multiplication generating electron-hole pairs, namely a hole current. Such hole current may flow to such ground from a base region of such BJT across a lateral resistance of a substrate, sometimes referred to as a "parasitic" lateral substrate resistance, to a p+ bulk region or tap in such substrate or p-well (hereinafter collectively and singly "substrate"). This current flowing across such a substrate resistance may cause a voltage to buildup triggering a "snapback" of the p+ tap-to-source junction, which may be used to dissipate energy to ground. Even though the term "bulk region" is used, the description herein applies to both bulk silicon wafers and silicon-on-insulator wafers. Other details regarding a ggNMOS structure may be found in "On-Chip ESD Protection for Integrated Circuits," by Albert Z. H. Wang, Kluwer Academic Publishers, published in 2002, at pages 54-55.

Generally, ggNMOS "snapback" happens when voltage applied at a pad, such as a voltage supply pad or I/O pad is higher than a trigger voltage. This condition of a voltage at such a pad being higher than a trigger voltage may lead to generation of holes due to impact ionization at a drain junction. A substrate current (e.g., a hole current) may flow through a substrate raising substrate potential. Such increase in substrate potential may eventually cause a source-to-substrate junction to be forward biased. Such forward biased condition may cause a substantial amount of electrons to be injected into such substrate. Such injected electrons may diffuse to a drain region, which in turn may generate excess electron-hole pairs. This generation of excess electron-hole pairs may cause a positive feedback effect which turns on a parasitic NPN BJT. Because such parasitic NPN BJT is turned on, such parasitic NPN BJT can sink a much higher level of current than an avalanche-breakdown current of a drain-to-substrate diode, and thus such parasitic NPN BJT goes into a stable snapback region.

Unfortunately, heretofore ggNMOS snapback used to facilitate substrate pumping (e.g., pumping of substrate current) for ESD consumed significant amounts of semiconductor real estate. Conventionally, ggNMOS structures were constrained to be laid out in a tile formation, where the entire layout had a square or square-like shape with a width (W) to length (L) ratio (W/L) equal to or at least approximately equal to 1. In such a layout, p+ taps were placed at the outer perimeter or edge of such a "square" to provide a sufficiently large substrate resistance. This layout constraint has meant a significant amount of semiconductor real estate is consumed for providing such separation to provide for a sufficiently large substrate resistance.

Hence, it is desirable and useful to provide a semiconductor structure for an ESD protection device for an IC that overcomes one or more of the above-described limitations.

SUMMARY

One or more embodiments generally relate to a semiconductor structure for an electrostatic discharge protection circuit for an IC.

An embodiment relates generally to a semiconductor structure for an electrostatic discharge ("ESD") protection circuit. In such an embodiment, there is a substrate of a first polarity type. A device area of the substrate has a source region and a drain region of a transistor. The device area is of the first polarity type, and the source region and the drain region are each of a second polarity type. A well region of the second polarity type surrounds the device area. An outer tap of the first polarity type surrounds the well region, and a bridge interconnects the source region and the outer tap.

Another embodiment relates generally to a layout structure for electrostatic discharge ("ESD") protection. In such an embodiment, a substrate has a first tap region, a well region, and a second tap region. The first tap region of a first polarity type surrounds a device area. The well region of a second polarity type surrounds the first tap region. The first polarity type and the second polarity type are opposite types of one another. The second tap region of the first polarity type surrounds the well region. First via plugs are disposed over a portion of the device area. Second via plugs are disposed over a portion of the second tap region. A first conductor is disposed over the portion of the device area and over the portion of the second tap region. The first conductor is raised up at least in part using the first via plugs and the second via plugs. The first conductor extends from the portion of the device area to the portion of the second tap region bridging the first tap region and the well region.

Yet another embodiment relates generally to an integrated circuit. In such an embodiment, there is a first pad. A second pad is coupled to a ground. An electrostatic discharge ("ESD") protection circuit is coupled between the first pad and the second pad. The ESD protection circuit includes a ground-gated transistor. The ground-gated transistor has a body region, a first source region, a first drain region, and a first gate. The first gate is coupled to the ground. The first source region and the first gate are coupled to the ground via at least one metal layer. A bridge is from the first gate and the first source region to a tap region. The tap region is located outside of a device area in which the ground-gated transistor is formed. The tap region is formed in a same substrate in which regions of the ground-gated transistor are formed.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

Figure 1:
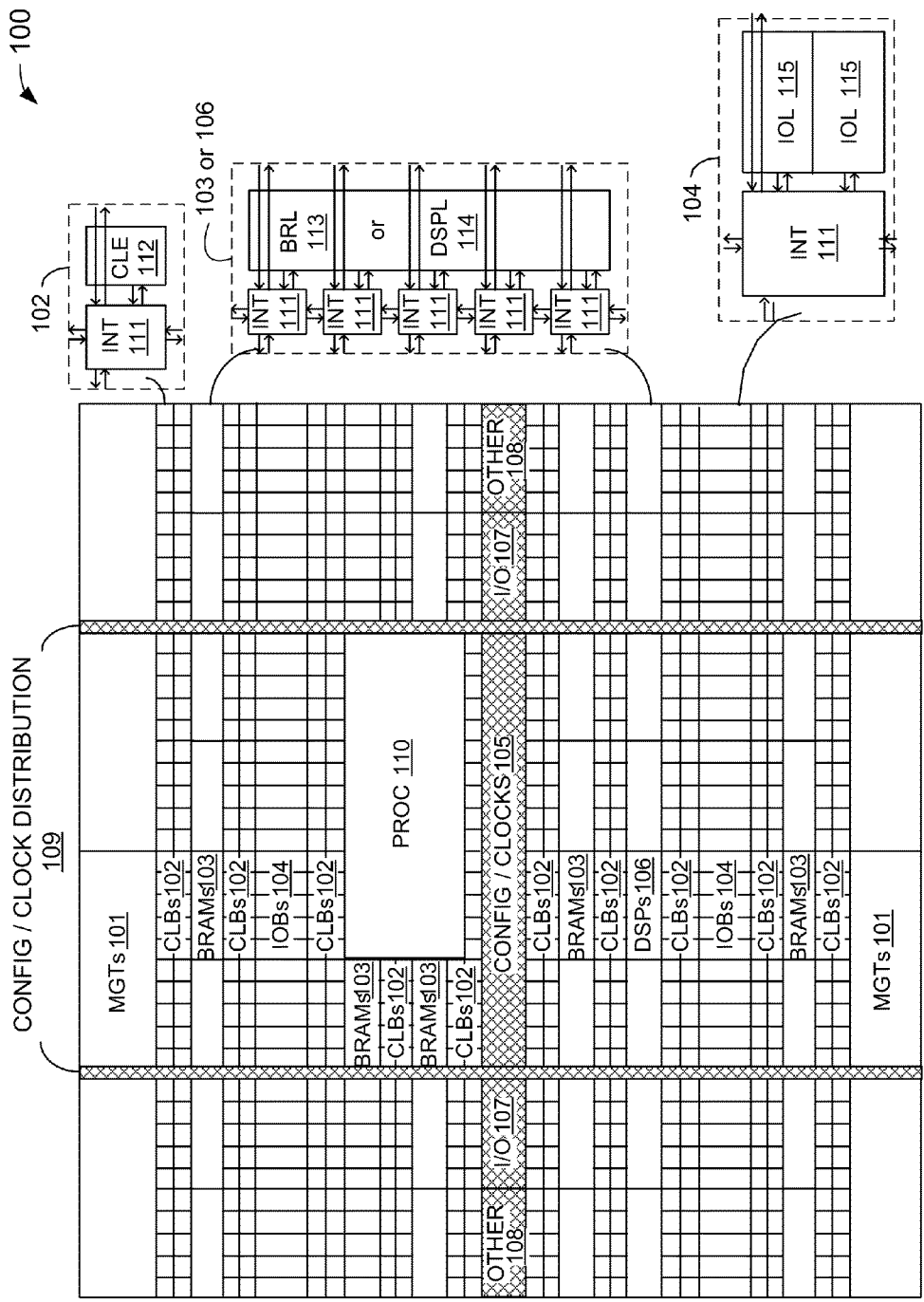
FIG. 1 is a simplified block diagram depicting an exemplary embodiment of a columnar Field Programmable Gate Array ("FPGA") architecture in which one or more aspects of the invention may be implemented.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Before describing exemplary embodiments illustratively depicted in the several figures, a general introduction is provided to further understanding. Heretofore, grounded-gate NMOS ("ggNMOS") devices consumed a significant amount of semiconductor real estate in order to provide a sufficient lateral parasitic substrate resistance for ESD protection, or more particularly sufficient energy dissipation of an ESD event.

However, as described below, such use of a lateral parasitic substrate resistance is avoided by moving ggNMOS body grounding outside a device area in which such ggNMOS device is formed. Instead of using a lateral parasitic substrate resistance, conductive lines coupled to such ggNMOS device are used to provide protection against an ESD event. More particularly, a bridge or jumper to a tap outside such device area is formed, and such tap is coupled to ground. Such a bridge provides coupling for purposes of pumping charge out of such device area to ground.

With the above general understanding borne in mind, various embodiments for an ESD protection circuit and structures therefor are described below. Because one or more of the above-described embodiments are exemplified using a particular type of IC, a detailed description of such an IC is provided below. However, any IC may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the I/O logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Even though the following description is in terms of an FPGA for purposes of clarity, the following description applies to any IC where electrostatic discharge ("ESD") protection is used.

Figure 2:
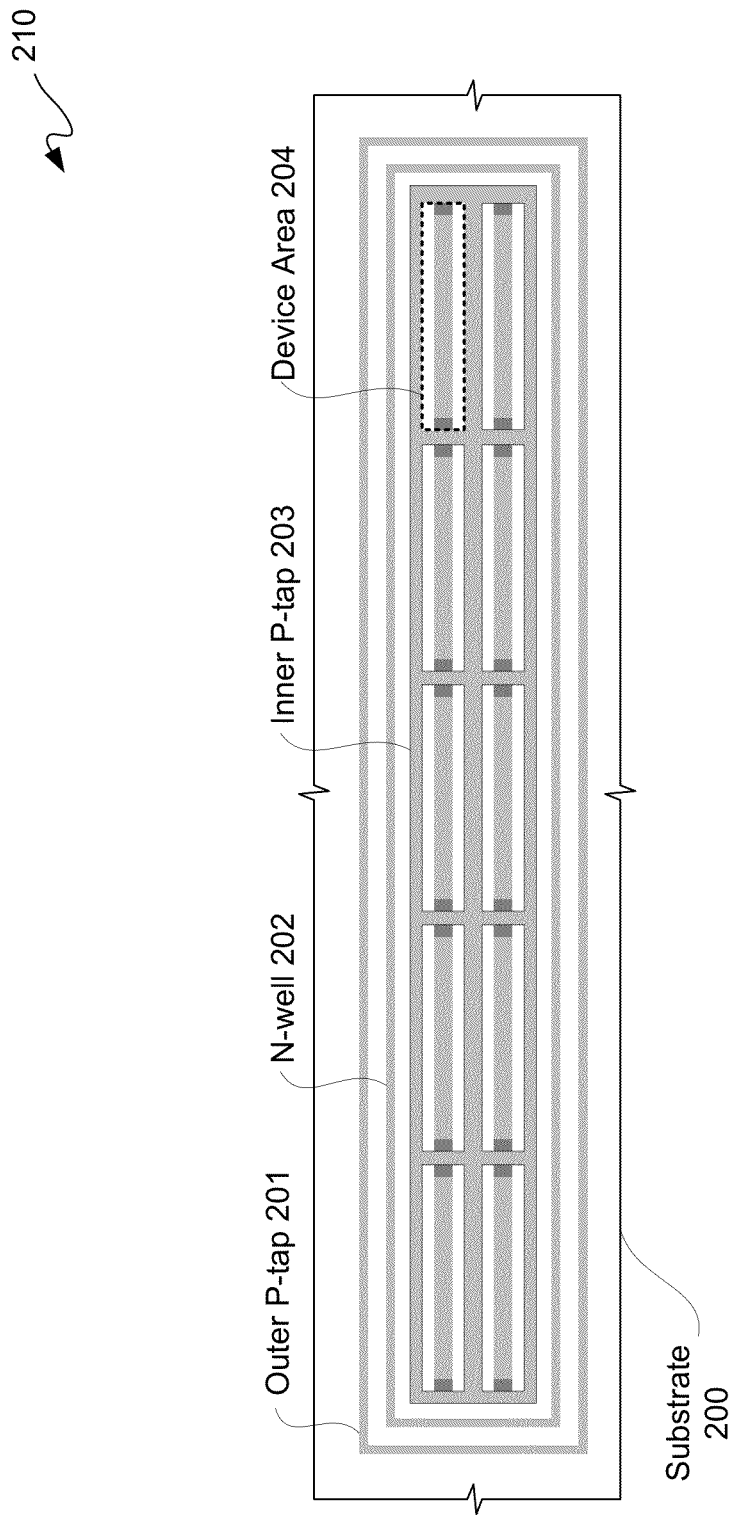
FIG. 2 is a block diagram depicting an exemplary embodiment of a layout structure for an electrostatic discharge ("ESD") protection circuit.

FIG. 2 is a block diagram depicting an exemplary embodiment of a layout structure 210 for an ESD protection circuit. A semiconductor substrate 200 has formed thereon and/or therein an outer p-tap 201, an n-well 202, and an inner p-tap 203, and device areas 204. In this exemplary embodiment, outer p-tap 201 is generally a rectangular ring, and n-well 202 is generally a rectangular ring inside outer p-tap 201. In this embodiment, outer p-tap 201 and n-well 202 are concentric-like rectangular rings, where outer p-tap 201 surrounds n-well 202. Surround as used herein does not mean completely enclosed. As used herein, surround generally means present around, near, along, or about most, if not all, sides in a horizontal plane generally associated with an upper surface or portion of a semiconductor substrate.

In this exemplary embodiment, inner p-tap 203 is generally a rectangular ring having an internal grid. Inner p-tap 203 is within n-well 202. With respect to a rectangular ring portion of inner p-tap 203, such rectangular ring portion is concentric-like within a rectangular ring of n-well 202. In this embodiment, inner p-tap 203 is surrounded by n-well 202.

A grid of inner p-tap 203 defines device areas 204 of semiconductor substrate 200 within an outer rectangular-ring portion of inner p-tap 203. Semiconductor substrate 200 may be a silicon substrate of a bulk silicon wafer; however, another type of semiconductor may be used. Furthermore, in another embodiment, a silicon-on-insulator ("SOI") wafer or other form of SOI wafer may be used.

In an embodiment, semiconductor substrate 200 is a p-type polarity. More particularly in an embodiment, semiconductor substrate 200 may have a p− doping concentration. Furthermore, in such an embodiment, inner p-tap 203 is likewise a p-type polarity but with a p+ doping concentration. However, in other embodiments other doping concentrations may be used. Furthermore, in this embodiment, an inner p-tap 203 is used, but electrically floats in semiconductor substrate 200 as described below in additional detail. In other embodiments, inner p-tap 203 may be omitted. However, for purposes of clarity and not limitation, it shall be assumed that outer p-tap 201 and inner p-tap 203 are each present and each have a p+ doping concentration and that semiconductor substrate 200 has a p− doping concentration.

Figure 3:
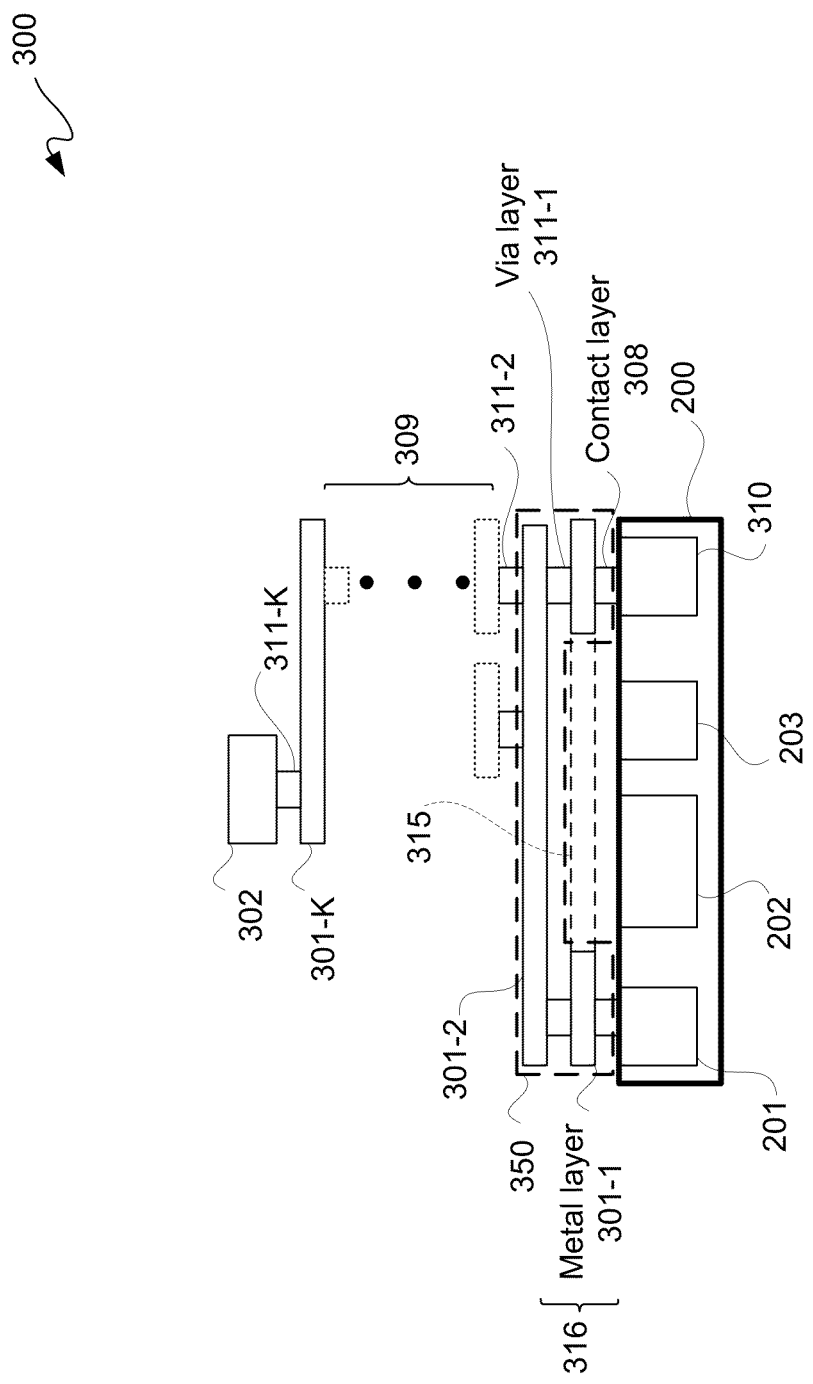
FIG. 3 is a block diagram depicting an exemplary embodiment of a cross section of a semiconductor structure for an ESD protection circuit.

FIG. 3 is a block diagram depicting an exemplary embodiment of a cross section of a semiconductor structure 300 for an ESD protection circuit. A source region 310 of a transistor, an inner p-tap 203, an outer p-tap 201, and an n-well 202 are formed in semiconductor substrate 200 ("substrate"). In this exemplary embodiment, source region 310 is an n-type region of a ggNMOS transistor. In this exemplary embodiment, source region 310 and inner p-tap 203 are spaced apart from one another, however, in another embodiment, source region 310 may be adjacent to inner p-tap 203. Furthermore, other structures, such as shallow trench isolation ("STI") structures and inter-dielectric layers ("ILDs"), among others, are not illustratively depicted for purposes of clarity and not limitation.

On an upper surface of substrate 200 may be formed contact layer 308 for providing respective contact plugs to outer p-tap 201 and source region 310. A conductor, such as a metal layer 301-1 may be formed over contact layer 308. In an embodiment, metal layer 301-1 in combination with contact layer 308 contact plugs may be for coupling outer p-tap 201 and source region 310, as generally indicated by dashed lines 315, to one another. However, metal layer 301-1 traces or lines may be more limited in size, such as width, than subsequent metal layers. The amount of resistance provided by a bridge formed using metal layer 301-1, as indicated by dashed lines 315, in some applications may not provide sufficient resistance for ESD energy dissipation, and thus another more resistive conductive material may be used. However, in some other applications, a metal layer 301-1 bridge may be used for interconnecting outer p-tap 201 and source region 310 to one another.

A via layer 311-1 is formed over metal layer 301-1 for providing respective via plugs to respective portions of metal layer 301-1 associated with contact plugs of contact layer 308 connected to outer p-tap 201 and source region 310. Thus, a contact plug, a metal portion, and via plug in combination may provide a stack, and separate stacks 316 may be formed for interconnections to each of outer p-tap 201 and source region 310.

A conductor, such as a metal layer 301-2 is formed over via layer 311-1. Metal layer 301-2 in combination with stacks 316 forms a bridge for bridging n-well 202 and inner p-tap 203. It should be appreciated that metal layer 301-2 may allow for a wider piece of metal than metal layer 301-1 due to more routing room at higher metal layers, namely metal layers further away from substrate 200.

A via layer 311-2 may be formed over metal layer 301-2. Furthermore, over via layer 311-2 may be formed one or more other respective metal and via layers as generally indicated by reference number 309. Thus, in this exemplary embodiment, a metal layer 301-K, for K a positive integer greater than two, may be used to interconnect to a ground pad 302 using a via provided by an intervening via layer 311-K. A portion of metal layer 301-2 used to provide a bridge, as previously described, is interconnected to ground pad 302. In other words, source region 310 and outer p-tap 201 are interconnected to one another and to ground pad 302. Even though the example of a second metal layer, namely metal layer 301-2, is used, in other embodiments a subsequent metal layer may be used for providing a bridge as described herein. Furthermore, in other embodiments, more than one bridging layer may be used, such as a "double decker" bridge for example. However, for purposes of clarity and not limitation, it shall be assumed that a "single decker" bridge is used.

In this embodiment, inner p-tap 203 is not connected to a metal layer that is connected to an active component. In other words, inner p-tap 203 electrically floats in substrate 200. For source region 310 of a ggNMOS transistor, a lateral parasitic substrate resistance previously provided by interconnecting inner p-tap 203 is replaced in this exemplary embodiment by bridge 350 from source region 310 to outer p-tap 201, as provided by stacks 316 and a portion of metal layer 301-2, as previously described.

In other words, a conductor jumper from source region 310 to outer p-tap 201 is formed for interconnecting a source region and a tap outside of a device area in which a ggNMOS transistor is formed. In the past, inner p-tap 203 was interconnected to ground; however, as described herein such grounding is now provided using outer p-tap 201, and inner p-tap 203 is left electrically floating in substrate 200. Effectively, ground has been moved from an inner p-tap 203 to an outer p-tap 201 with respect to a ggNMOS transistor, where such outer p-tap 201 is displaced from source region 310 by at least one well, such as n-well 202. Thus, rather than using a lateral parasitic substrate resistance associated with a parasitic NPN BJT, such substrate resistance is effectively provided by outer p-tap 201, as well as such conductor jumper.

Figure 4:
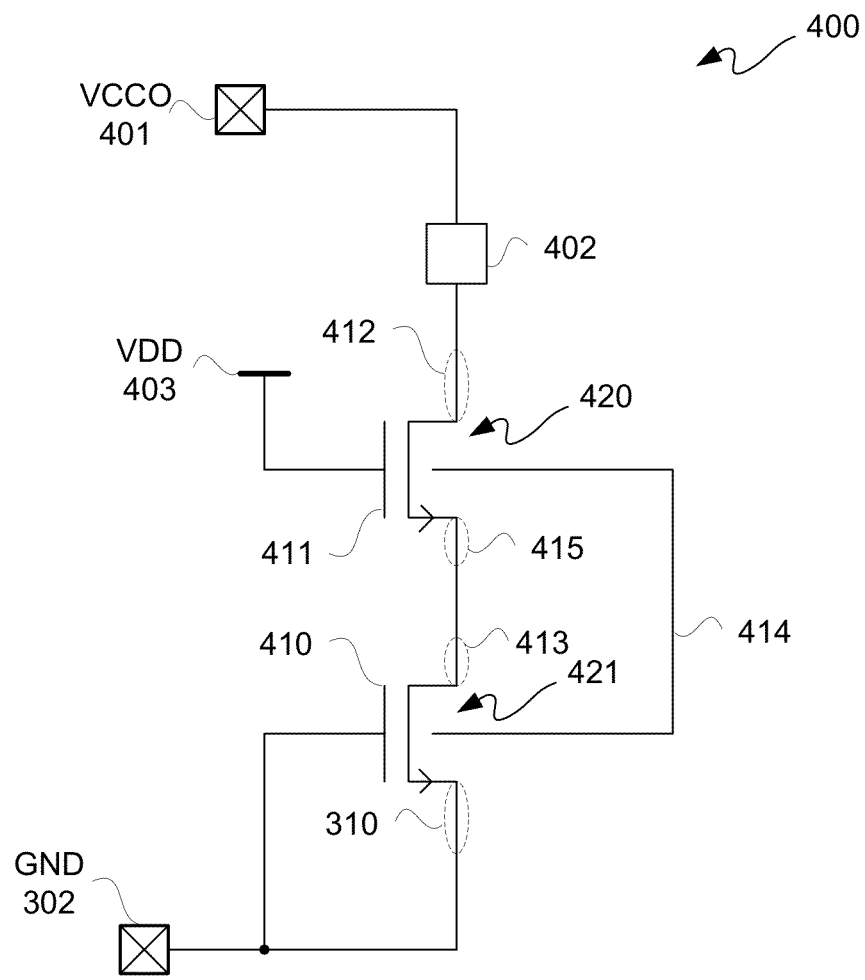
FIG. 4 is a block/circuit diagram depicting an exemplary embodiment of an ESD protection circuit.

FIG. 4 is a block/circuit diagram depicting an exemplary embodiment of an ESD protection circuit 400. In contrast to a single NMOS device as in semiconductor structure 300 of FIG. 3, ESD protection circuit 400 includes two NMOS devices in a cascode-like configuration.

In ESD protection circuit 400, a supply voltage pad 401 may be coupled to an ESD impedance circuit block 402. In this exemplary embodiment, supply voltage pad 401 is for a VCC voltage. More particularly, in this exemplary embodiment a VCCO voltage, e.g., an I/O supply voltage in some integrated circuits, is used. However, in other embodiments other types of supply voltages may be used. Moreover, in other embodiments, an input, output, or I/O pad 401 may be used. A ggNMOS device as described herein may be used for a power supply ESD clamp and/or an I/O ESD clamp.

ESD impedance ("ESDIMP") circuit block 402 may be a p+ zener diode creation diffusion region in a substrate, such as may be created with an implant. Optionally, ESD impedance circuit block 402 may include a silicide block layer. Components of NMOS transistors 420 and 421 may be undergo silicidation. In embodiments, such silicidation may be performed in a self-aligned manner, namely salicidation. A mask may be used for silicide blocking, such as for example to ensure sheet resistivity remains higher in a masked off region than a silicided region, such as a silicided portion of drain of a transistor for example, as silicidation may be used to reduce sheet resistivity.

In this embodiment of ESD protection circuit 400, an NMOS transistor 420 has its drain region 412 coupled to ESD impedance circuit block 402. A gate 411 of NMOS transistor 420 is coupled to receive a supply voltage 403. In this exemplary embodiment, supply voltage 403 is a VDD voltage, namely a high logic-level supply voltage. A source region 415 of NMOS transistor 420 is in series with a drain region 413 of NMOS transistor 421.

NMOS transistor 421 is a ggNMOS transistor. A gate of a gate stack, as generally indicated as gate or gate stack 410, of NMOS transistor 421 is interconnected to a VSS or ground, such as through ground pad 302. A source region 310 of NMOS transistor 421 is interconnected to ground pad 302. Such interconnection of source region 310 may be as previously described with reference to FIG. 3.

A body region of NMOS transistor 420 may be of the same substrate as a body region of NMOS transistor 421, and such body regions of transistors 420 and 421 may be interconnected by interconnect 414. However, a body region of NMOS transistor 421 is not interconnected to ground, such as with ground pad 302, through an inner p-tap 203.

Figure 5:
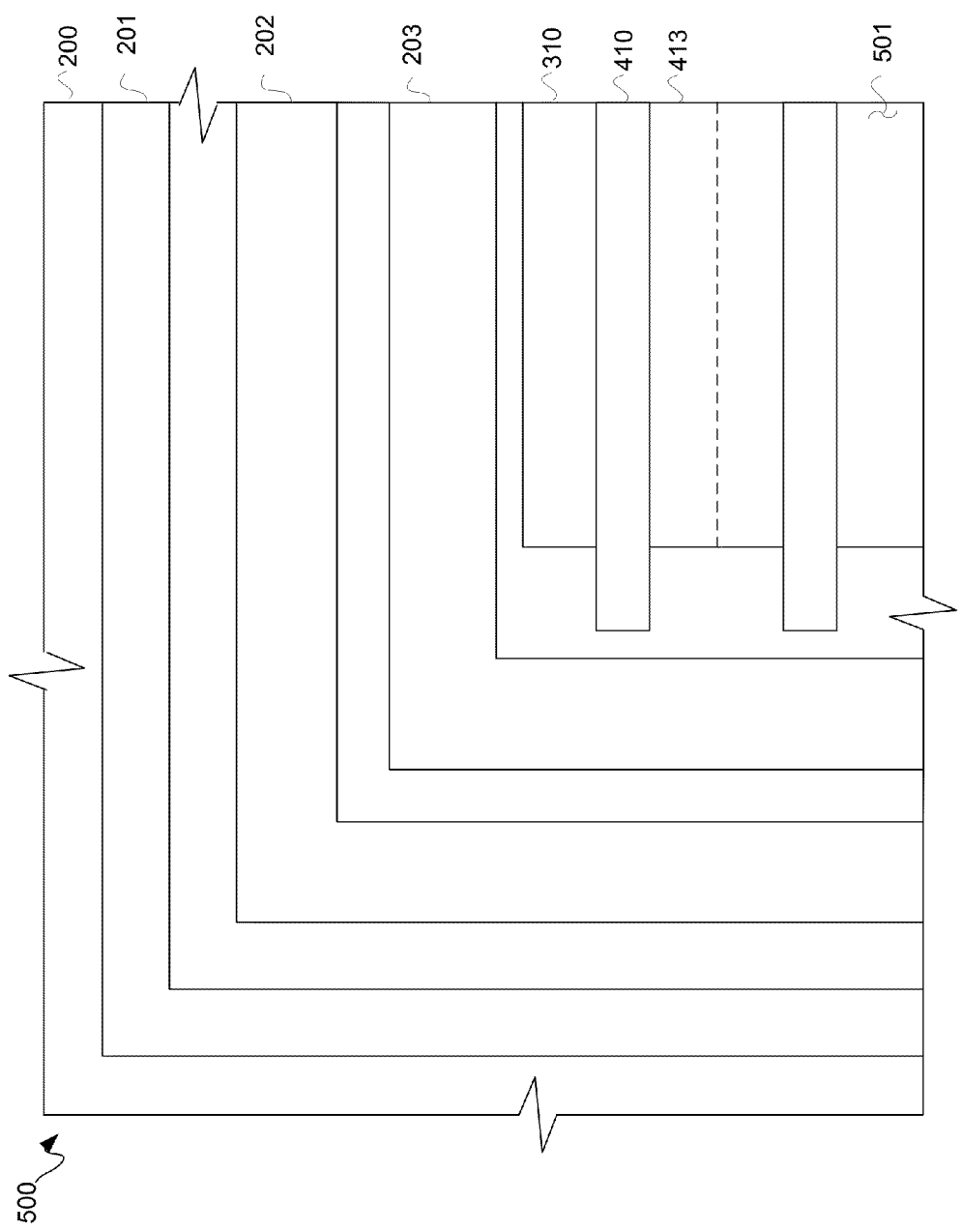
FIG. 5 is a block diagram depicting an exemplary embodiment of an enlarged portion of the layout structure of FIG. 2.

FIG. 5 is a block diagram depicting an exemplary embodiment of an enlarged portion 500 of the layout structure of FIG. 2. Gates or gate stacks 410 and 411 of FIG. 4 each generally represent one or more gate dielectrics upon which are one or more gate conductors, where such gates or gate stacks 410 and 411 are disposed over substrate 200. As illustratively depicted, an active area 501 may be used for forming source region 310 and drain region 413 on respective sides of gate stack 410. Again, isolation structures are not illustratively depicted for purposes of clarity and not dictation. Likewise, other transistors may be formed using active area 501.

Figure 6:
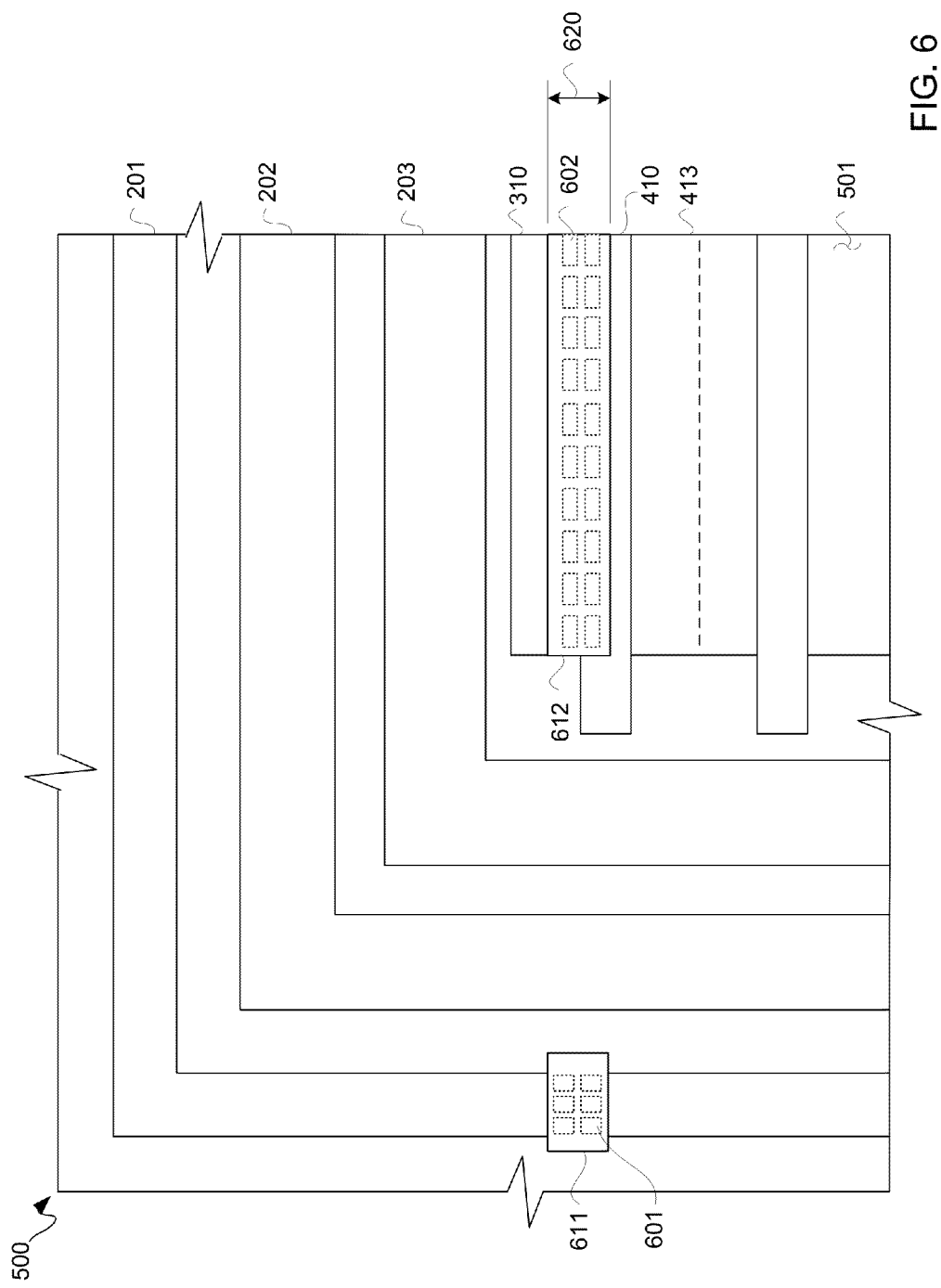
FIG. 6 is the block diagram of FIG. 5 after formation of a contact layer and a metal layer.

FIG. 6 is the block diagram of FIG. 5 after formation of a contact layer and a metal layer, such as contact layer 308 and a metal layer 301-1, respectively, of FIG. 3. Contact layer 308 is formed over and in contact with a portion of outer p-tap 201 prior to formation of metal layer 301-1. In this regard, contact layer 308 is used for forming contact plugs 601 over any contact with such portion of outer p-tap 201.

Additionally, contact layer 308 is formed over a portion of a device area, such as a device area 204 of FIG. 2. More particularly, contact layer 308 is formed over a portion of gate stack 410 and a portion of source region 310 in a device area. In this regard, contact layer 308 is used for forming contact plugs 602 over and in contact with source region 310 and gate stack 410.

Contact plugs 601 and 602 are indicated with dotted lines, as they are located beneath metal layer 301-1. After formation of contact plugs 601 and 602, both of which may be simultaneously formed with deposition of contact layer 308, metal layer 301-1 may be deposited to provide associated conductive segments 611 and 612 of width 620. Again, ILDs are not illustratively depicted for purposes of clarity and not limitation in the formation of plugs and conductive lines or segments. Generally contact plugs 601 and 602 raise up or offset metal layer segments 611 and 612, respectively, from substrate 200 for providing interconnects, as described elsewhere herein.

Figure 7:
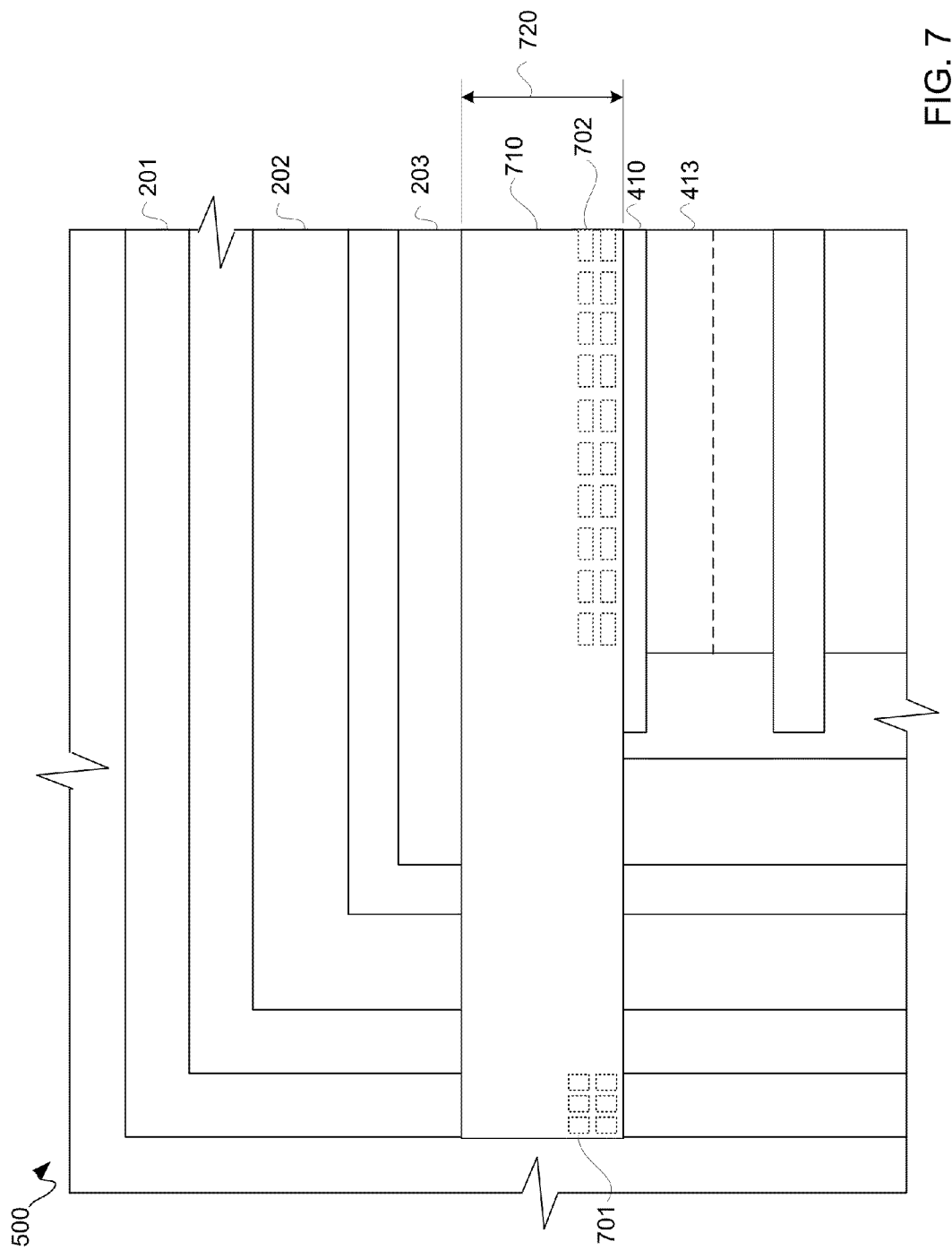
FIG. 7 is the block diagram of FIG. 6 after formation of a via layer and another metal layer.

FIG. 7 is the block diagram of FIG. 6 after formation of a via layer and another metal layer, such as via layer 311-1 and metal layer 301-2, respectively, of FIG. 3. A via layer 311-1 is formed over and in contact with segments 611 and 612 of metal layer 301-1. Via layer 311-1 is used for forming via plugs 701 for contact with segment 611 proximate to contact plugs 601, and via layer 311-1 is used for forming via plugs 702 proximate to contact plugs 602 for contact with segment 612. Via plugs 701 and 702 may be simultaneously formed with deposition of a via layer 311-1.

Via plugs 701 and 702 are indicated with dotted lines, as they are located beneath metal layer 301-2. After formation of via layer 311-1, metal layer 301-2 may be deposited to form a conductive line 710. Again, ILDs are not illustratively depicted for purposes of clarity and not limitation in the formation of plugs and conductive lines or segments. Conductive line 710 extends between spaced apart locations, namely generally from via plugs 701 to via plugs 702. It should be appreciated that width 720 of conductive line 710 is substantially wider than width 620 of metal layer segments 611 and 612 of FIG. 6, so that conductive line 710 provides more resistance, R. In this exemplary embodiment, stacked interconnects of contact plugs, metal segments, and via plugs are used to raise conductive line 710 away from an upper surface of substrate 200.

Figure 8:
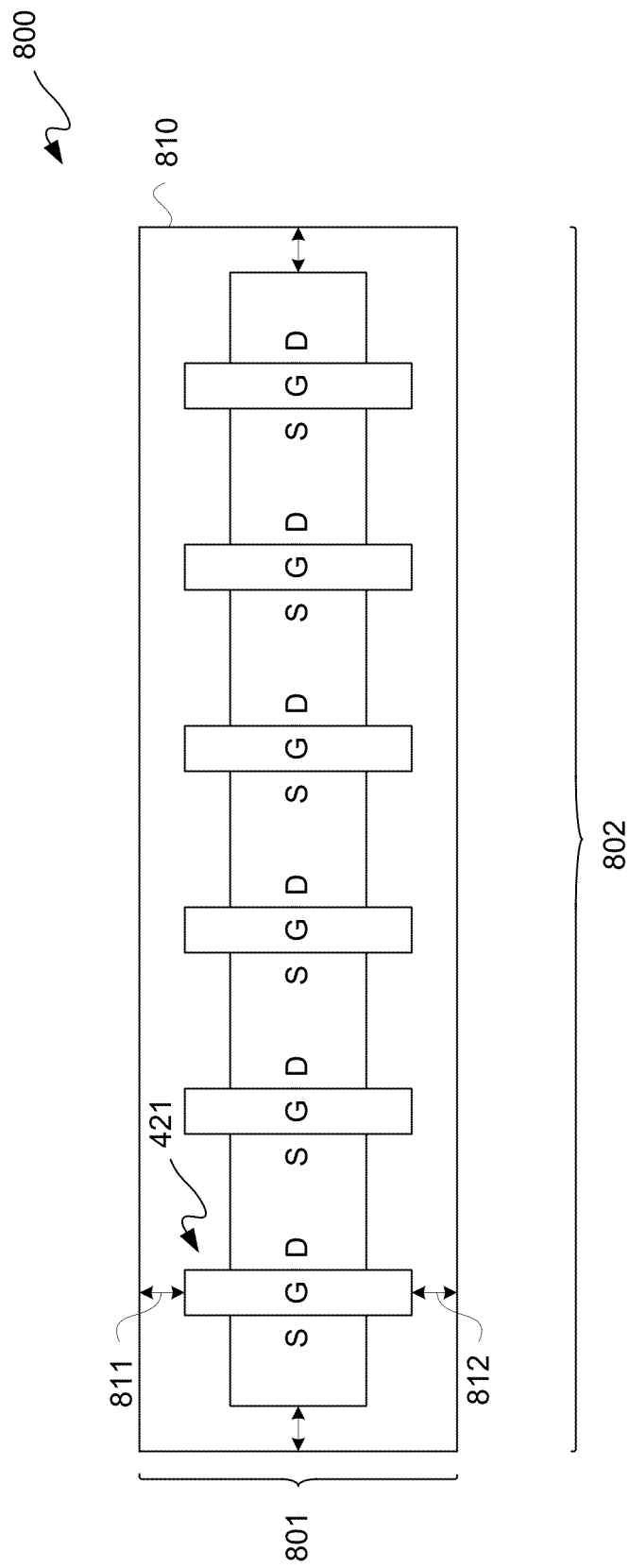
FIG. 8 is a block diagram depicting an exemplary embodiment of a layout for ESD protection circuit transistors having a high layout aspect ratio.

FIG. 8 is a block diagram depicting an exemplary embodiment of a layout 800 for ESD protection circuit transistors 421. Layout 800 has a high layout aspect ratio. In other words, device active area 810 has a layout aspect ratio in a range of approximately ½ to 1/10. Distances 811 and 812 are substantially shorter than in the past. In other words, less distance is consumed because generally having a parasitic substrate resistance of sufficient magnitude for ESD protection is avoided. Rather, generally such resistance is provided by an outer p tap by bridging to it with a jumper as previously described. Thus, less semiconductor real estate is used per ESD protection circuit transistors 421 than in the past. Length 802 and width 801 do not have to be equal or approximately equal as was generally a condition in the past. Thus, for example, a rectangular strip for device active area 810 may be used for forming a single row or column of transistors for ESD protection circuits transistors 421.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. A semiconductor structure for an electrostatic discharge ("ESD") protection circuit, comprising:
    a substrate of a first polarity type;
    a device area of the substrate having a source region and a drain region of a transistor;
    wherein the device area is of the first polarity type;
    wherein the source region and the drain region are each of a second polarity type;
    a well region of the second polarity type surrounding the device area;
    an outer tap of the first polarity type surrounding the well region; and
    a bridge interconnecting the source region and the outer tap.

2. The semiconductor structure according to claim 1, further comprising:
    an inner tap of the first polarity type surrounding the device area and surrounded by the well region;
    the source region and the drain region are disposed at a first side and a second side, respectively, of a gate stack of the transistor; and
    the gate stack is disposed over the substrate.

3. The semiconductor structure according to claim 2, wherein the inner tap is not interconnected to the source region using any metal layer.

4. The semiconductor structure according to claim 3, wherein:
    the first polarity type is a p-type polarity;
    the second polarity type is an n-type polarity; and
    the outer tap and the substrate have a p+ concentration of the p-type polarity and a p− concentration of the p-type polarity, respectively.

5. The semiconductor structure according to claim 2, wherein the bridge includes:
    a contact layer to provide a first contact plug and a second contact plug respectively for the source region and the outer tap; and
    a first metal layer respectively coupled to the first contact plug and the second contact plug.

6. The semiconductor structure according to claim 5, wherein the bridge further includes:
    a via layer having a first via plug and a second via plug respectively coupled to the first metal layer at a first location and a second location;
    wherein the first location is proximate to the first contact plug;
    wherein the second location is proximate to the second contact plug;
    a second metal layer coupling the first via plug and the second via plug; and
    wherein the second metal layer bridges the inner tap and the well region to interconnect the source region and the outer tap.

7. The semiconductor structure according to claim 6, wherein the substrate is selected from a group consisting of a bulk semiconductor substrate and a semiconductor-on-insulator substrate.

8. A layout structure for electrostatic discharge ("ESD") protection, comprising:
    a substrate having a first tap region, a well region, and a second tap region;
    the first tap region of a first polarity type surrounding a device area;
    the well region of a second polarity type surrounding the first tap region;
    wherein the first polarity type and the second polarity type are opposite types of one another;
    the second tap region of the first polarity type surrounding the well region;
    first via plugs disposed over a portion of the device area;
    second via plugs disposed over a portion of the second tap region;
    a first conductor disposed over the portion of the device area and over the portion of the second tap region;
    wherein the first conductor is raised up at least in part using the first via plugs and the second via plugs; and
    wherein the first conductor extends from the portion of the device area to the portion of the second tap region bridging the first tap region and the well region.

9. The layout structure according to claim 8, further comprising:
    a second conductor disposed over the portion of the device area raised up by the first via plugs;
    first contact plugs disposed on the second conductor;
    a third conductor disposed over the portion of the second tap region raised up by the second via plugs;
    second contact plugs disposed on the second conductor;
    wherein the second conductor is disposed between the first contact plugs and the first via plugs;

wherein the third conductor is disposed between the second contact plugs and the second via plugs;
wherein the first conductor is raised up at least in part by a first stack and a second stack;
wherein the first stack includes the first via plugs, the second conductor, and the first contact plugs; and
wherein the second stack includes the second via plugs, the third conductor, and the second contact plugs.

10. The layout structure according to claim 9, wherein:
the second conductor and the third conductor are formed by deposition of a first metal layer; and
the first conductor is formed by deposition of a second metal layer deposited subsequent to the first metal layer.

11. The layout structure according to claim 8, wherein the device area is a rectangular strip for forming a single row or column of transistors.

12. An integrated circuit, comprising:
a first pad;
a second pad coupled to a ground;
an electrostatic discharge ("ESD") protection circuit coupled between the first pad and the second pad;
the ESD protection circuit including a ground-gated transistor;
wherein the ground-gated transistor is an NMOS transistor;
the ground-gated transistor having a first body region, a first source region, a first drain region, and a first gate;
the first gate coupled to the ground;
the first source region and the first gate coupled to the ground via at least one metal layer;
the first body region is not interconnected to the ground; and
a bridge from the first gate and the first source region to a tap region;
wherein the tap region is located outside of a device area in which the ground-gated transistor is formed; and
wherein the tap region is formed in a same substrate in which regions of the ground-gated transistor are formed.

13. The integrated circuit according to claim 12, wherein the first gate is coupled to the ground via the second pad.

14. The integrated circuit according to claim 12, further comprising:
a bulk region in the substrate in the device area;
wherein the bulk region is not connected so as to electrically float in the substrate.

15. The integrated circuit according to claim 12, wherein the ESD protection circuit further includes:
a supply-gated transistor having a second body region, a second source region, a second drain region, and a second gate;
wherein the second gate is coupled to a first supply voltage;
wherein the first drain region is in series with the second source region;
wherein the first body region and the second body region are interconnected to one another and are not interconnected to the ground; and
wherein the second drain region is coupled to the first pad.

16. The integrated circuit according to claim 15, wherein the first pad is selected from a group consisting of a supply voltage pad and an input/output pad.

17. The integrated circuit according to claim 15, further comprising an ESD impedance circuit block coupled between the first pad and the second drain region.

18. The integrated circuit according to claim 15, wherein:
the ground-gated transistor is a first NMOS transistor; and
the supply-gated transistor is a second NMOS transistor.

19. The integrated circuit according to claim 15, wherein:
the first supply voltage is a high logic-level supply voltage;
the first pad is a supply voltage pad coupled to a second supply voltage; and
the second supply voltage is an I/O supply voltage.

20. The integrated circuit according to claim 15, wherein the device area is a rectangular strip for forming a single row or column of transistors including the ground-gated transistor.

* * * * *